(12) United States Patent
Jean et al.

(10) Patent No.: US 10,727,765 B1
(45) Date of Patent: Jul. 28, 2020

(54) MEMS FRICTION DRIVE LINEAR MOTOR

(71) Applicants: Daniel Louis Jean, Odenton, MD (US); Ezra Chen, Bowie, MD (US); Troy Caruso, Sterling Heights, MI (US); Andrew Jen, Alexandria, VA (US)

(72) Inventors: Daniel Louis Jean, Odenton, MD (US); Ezra Chen, Bowie, MD (US); Troy Caruso, Sterling Heights, MI (US); Andrew Jen, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 396 days.

(21) Appl. No.: 15/731,539

(22) Filed: Jun. 27, 2017

(51) Int. Cl.
  *H02N 10/00* (2006.01)
  *F03G 7/06* (2006.01)

(52) U.S. Cl.
  CPC .................. *H02N 10/00* (2013.01)

(58) Field of Classification Search
  CPC ............ H02N 10/00; H02N 1/04; F03G 7/06
  See application file for complete search history.

(56) References Cited

U.S. PATENT DOCUMENTS

| | | | | |
|---|---|---|---|---|
| 6,338,249 B1 * | 1/2002 | Pai | ................... | B81B 3/0024 60/527 |
| 6,351,580 B1 * | 2/2002 | Dhuler | ................ | B81B 3/0054 385/136 |
| 6,388,359 B1 * | 5/2002 | Duelli | ................... | G02B 6/357 310/309 |
| 6,675,578 B1 | 1/2004 | Sinclair | | |
| 6,901,204 B2 * | 5/2005 | Hong | ................... | G02B 6/266 359/196.1 |
| 7,007,471 B2 * | 3/2006 | Sinclair | ............... | B81B 3/0024 310/307 |
| 7,113,689 B2 * | 9/2006 | Hong | .................. | G02B 6/266 359/227 |
| 7,567,011 B1 | 7/2009 | Jean | | |
| 9,531,302 B1 * | 12/2016 | Cochran | ............... | H02N 2/021 |
| 2004/0126080 A1 * | 7/2004 | Hong | .................. | G02B 6/266 385/140 |
| 2011/0102875 A1 | 5/2011 | Yang et al. | | |

OTHER PUBLICATIONS

John Maloney http://john.maloney.org/thermal_actuation.htm.

* cited by examiner

*Primary Examiner* — Edgardo San Martin
(74) *Attorney, Agent, or Firm* — Fredric J. Zimmerman (57) ABSTRACT

The friction driven linear motor includes a slide element with a portion with a pair of parallel straight sides. The slide element is contiguous with a zig-zag spring-like element, which is contiguous with an anchor block, which is contiguous with a MEMS substrate. The zig-zag spring-like element deforms as the slide element moves away from the anchor block. There are opposing pairs of v-beam thermal actuators. Each actuator includes a projecting cantilever beam with an end tip cycled to impinge, angularly, the slide element and extend, therein frictionally pushing the slide. A modulating current ohmically cycles the actuator from retraction to braking to pushing. At high frequencies the cantilever beam never fully retracts. The entire linear motor is composed of and is etched on a MEMS substrate.

20 Claims, 5 Drawing Sheets

MEMS FRICTION DRIVE LINEAR MOTOR

STATEMENT OF GOVERNMENT INTEREST

The invention described herein may be manufactured and used by or for the Government of the United States of America for Governmental purposes without the payment of any royalties thereon or therefore.

BACKGROUND OF THE INVENTION

Field of the Invention

The invention relates generally to linear motors, and particularly to micro linear motors that utilize MEMS (Microelectromechanical Systems) technology to form very small motors using ingenious electro-mechanical actuators to impart linear movement.

Background

Conventional technology describes an in-plane thermal buckle-beam micro-electrical mechanical actuator formed on a planar substrate of a semiconductor material. The actuator includes first and second anchors secured to the substrate and a floating center beam positioned between the first and second anchors and movable relative to the substrate.

Groups of the actuators having a floating center beam can be used as a brake to stop linear movement of an orthogonal element. The actuators have symmetric first and second sets of elongated thermal half-beams secured between opposite sides of the floating center beam and the respective first and second anchors. The half-beams are formed of single crystal silicon or a polysilicon. The prior art teaches that a current source directs electrical current through the thermal half beams via the anchors to impart thermal expansion of the thermal half-beams and hence linear motion of the floating center beam that is generally parallel to the substrate. In one implementation, the half-beams are configured at a bias angle to give the floating beam an affinity for in-plane motion.

SUMMARY OF THE INVENTION

A first object of the invention includes a use of MEMS (microelectromechanical systems) technology to form a friction drive linear motor, where the friction drive linear motor has at least one pair of v-beam thermal actuators, where each actuator has a cantilever beam that through frictional contact moves a slide element. An aspect of the first object is that the invention is formed on a planar MEMS substrate using three dimensional etching. The substrate is generally a doped silicon, and the MEMS is employed to make very small devices, where very small is generally on the order of less than 100 millimeters square.

A second object of the invention is that most of the elements of the friction drive linear motor are made with the same material (i.e. doped silicon), which is a semi-conductive elastic material with a high melting point (~1400° C.). An aspect of the second objective is that an element's morphology is selected to have a desired response to an electric current. For example each of the actuators utilizes thermal expansion from ohmic heating to generate motion, therefore elements that have ohmic heating producing thermal expansion are substantially thinner than elements that have very little ohmic heating and minimal thermal expansion. The thicker elements on the linear motor are generally cross-sectionally about 25 to 100 times greater than the thinner elements. An application of a thicker element is a terminal that is anchored to the substrate for the linear motor. The thinner element is normally contiguous with the thicker element, only thinner and therefore subject to ohmic heating.

A third object of the invention is that a slide element may be moved by a v-beam thermal actuator having a cantilever beam. The cantilever beam, when actuated may generate enough friction through impingement contact of a tip of the cantilever beam against a straight side wall of the slide element that the frictional resistance between the tip and the side wall will be greater than the resistance of the slide element to move. It may take several v-beam thermal actuators arranged in various opposing configurations, but ultimately the slide element may be moved with only frictional contact. The slide element may even be elastically and mechanically restrained, for example by a spring-like element that is contiguous on one end with an anchor block of the substrate and on another end with the slide element, where the spring-like element elastically deforms as the linear motor moves the slide element away from the anchor block.

A fourth object is that when the current is modulated at about 80 Hz to 1 MHz, the actuators can with frictional contact move the slide element without a braking step. As will become evident as the slide element is moved, an attached spring-like element is tensioned. When the current is cut the v-beam actuators retract enabling the slide element to return, elastically, to a starting position.

A fifth object is that the frictional contact created by the actuated opposing cantilever beams against the slide element generates enough force that that the slide element can be linearly moved without the use of intermeshing gears or ratchets or additional brakes.

BRIEF DESCRIPTION OF THE DRAWINGS

The foregoing invention will become readily apparent by referring to the following detailed description and the appended drawings in which.

DETAILED DESCRIPTION OF THE INVENTION

Figure 2A:
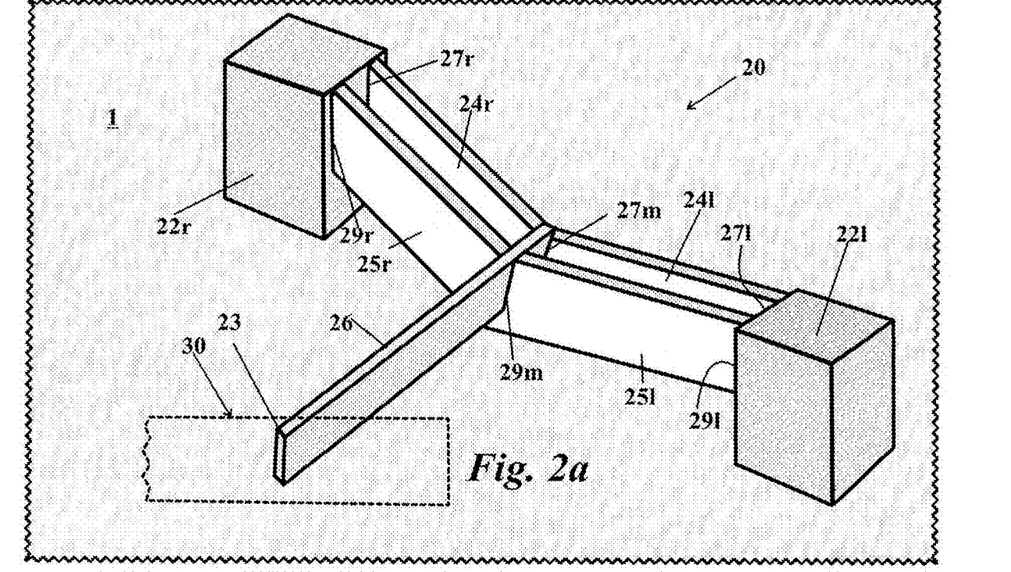
FIG. 2a is a perspective view of one of the v-beam actuators as illustrated in FIG. 1a and the slider element shown in ghost, where the half beams are contiguous with the terminal anchors and the cantilever beam and the half beams and the cantilever beam are not attached to the substrate.
Figure 3A:
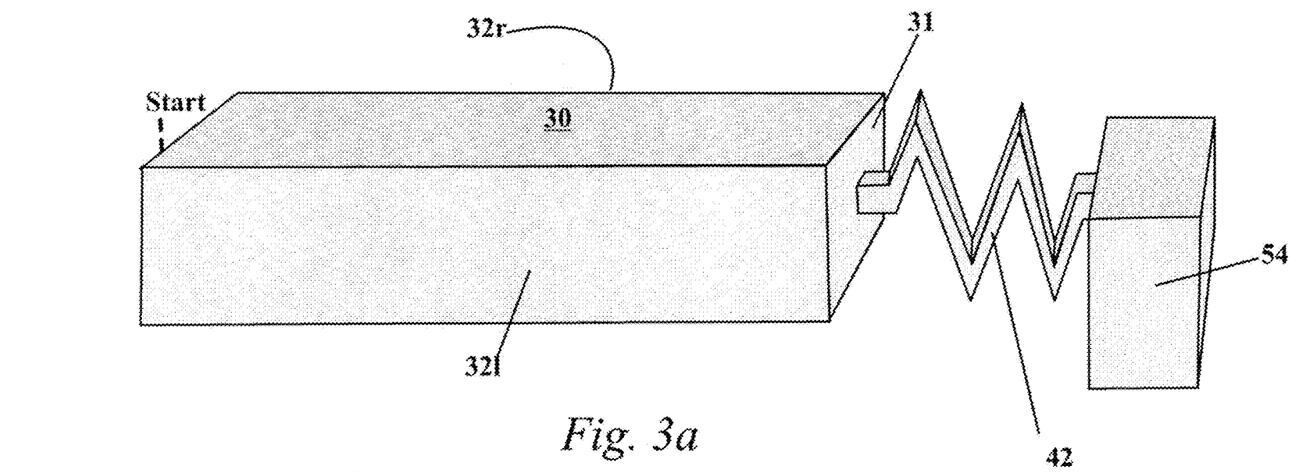
FIG. 3a is a perspective view of the slider element, where a zig-zag spring-like element that is contiguous on an end with an anchor block of the substrate and on another end with the slide element, where the zig-zag spring-like element is not elastically deformed as the slide element of friction driven motor is at a start position.
Figure 3B:
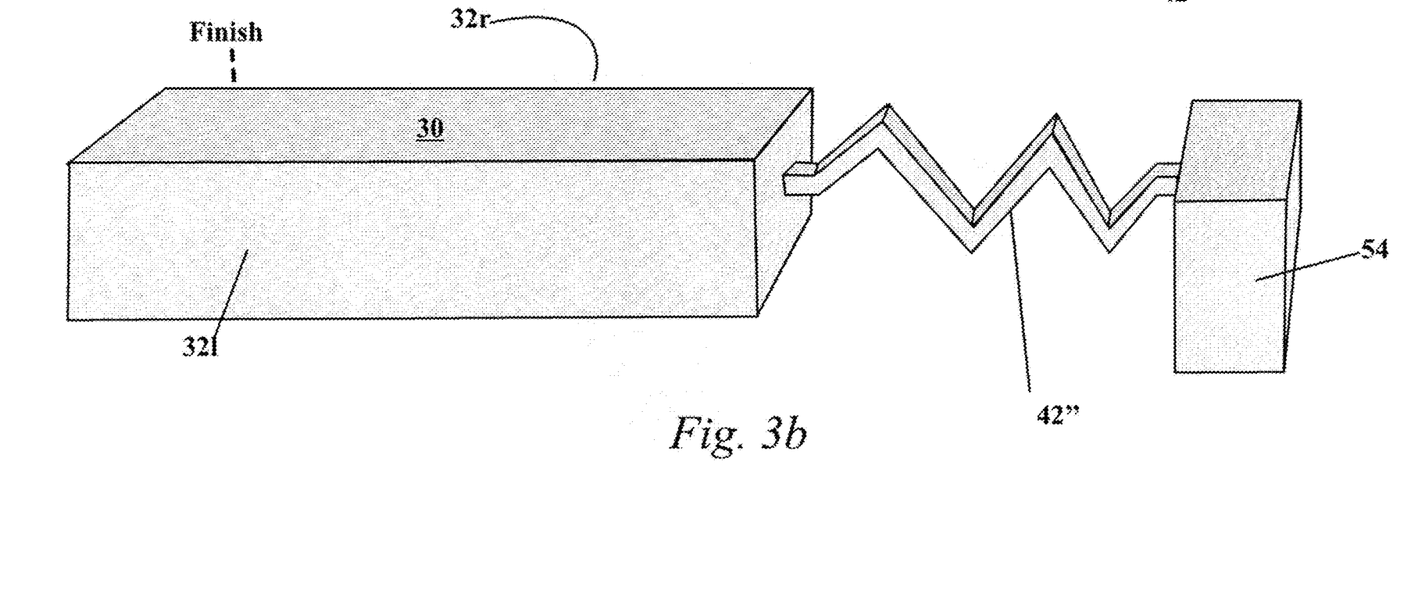
FIG. 3b is a perspective view of the slider element shown in FIG. 3a, where the slider element has been pushed to the left, therein extending and tensioning the zig-zag spring-like element which is attached to the anchor block of the substrate.

A friction driven linear motor 10 includes a slide element 30 as illustrated in FIG. 3a that has a portion with a first straight side 32r, a second straight side 32l and a rear end 31. The first straight side and the second straight side are a pair of opposing sides of the slide element. The rear end of the slide element is contiguous to a zig-zag spring-like element 42 that is contiguous with an anchor block 54 that is contiguous with a MEMS substrate 1 that is partially shown in FIGS. 2a and 3a. The zig-zag spring-like element 42 elastically deforms, as shown in FIG. 3b, as the slide element 30 moves away from the anchor block 54. Stages of deformation 42,42',42" are shown in FIGS. 1a,1b and 1c.

Figure 1A:
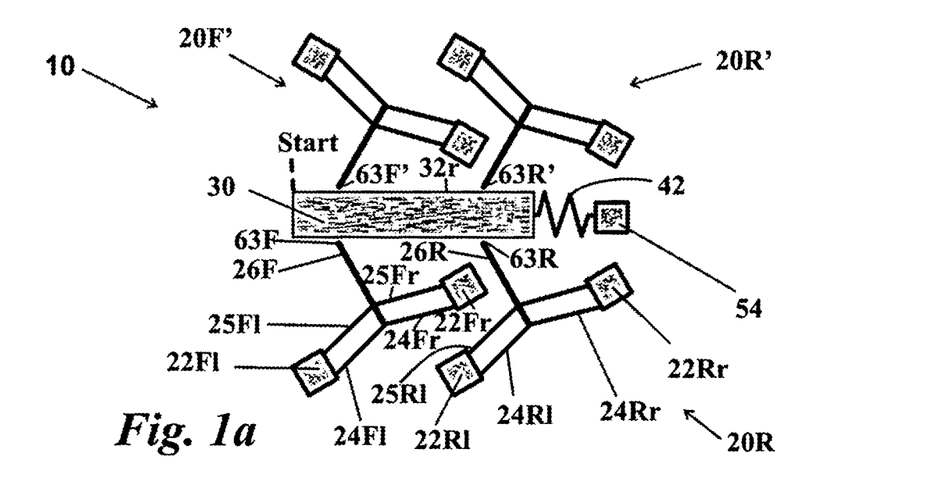
FIG. 1a is a diagrammatic view of a friction driven linear motor, where the two pair of opposing v-beam actuators (currently not actuated) are angled with respect to the slide element, therefore the cantilever beams are fully retracted and are not even touching the slide element, and the friction driven linear motor is stationary in its start position.
Figure 1B:
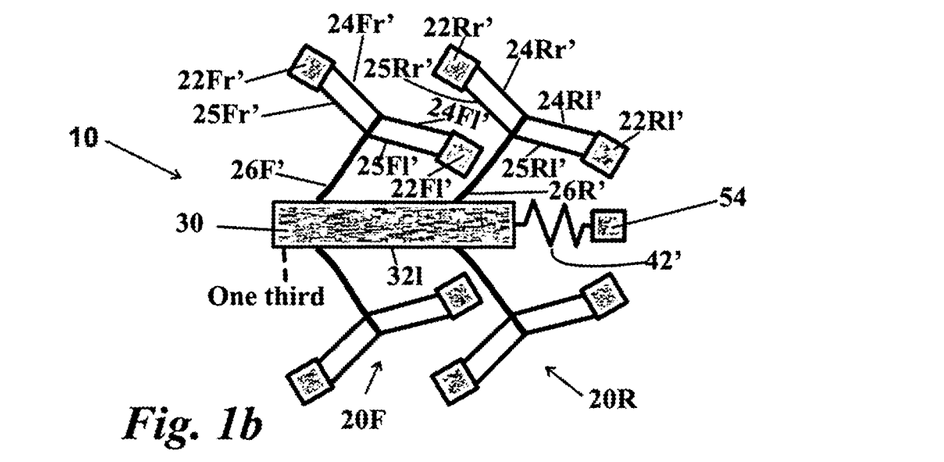
FIG. 1b is a diagrammatic view of the friction driven linear motor illustrated in FIG. 1a, where the two pair of opposing v-beam actuators have a current, the half beams have expanded causing the cantilever beams to press, angularly and frictionally, against the slide element causing the cantilever beams to bend and the linear motor to just start moving.
Figure 1C:
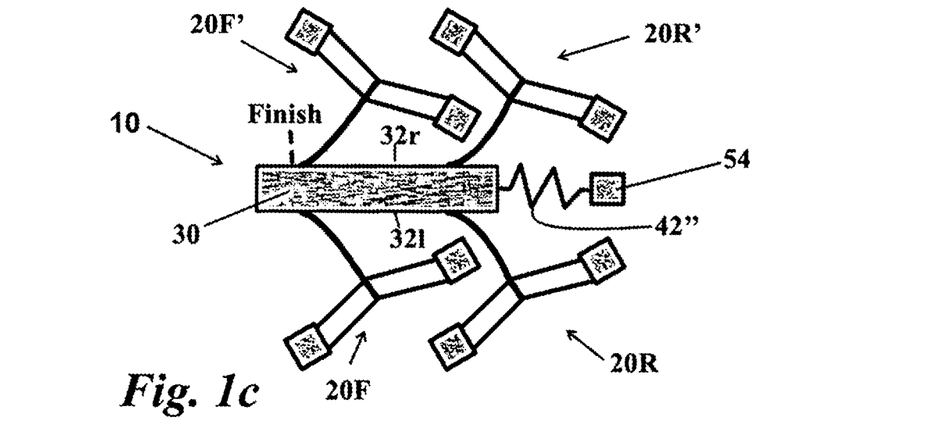
FIG. 1c is a diagrammatic view of the friction driven linear motor illustrated in FIG. 1b, where the cantilever beams are extended to their maximum throw, increasing the friction and the bending, where an end tip of each of the cantilever beams is nearly parallel with the slide element.

There is at least one pair of v-beam thermal actuators as shown in FIGS. 1a,1b and 1c, and, in an exemplary embodiment, there is a rear pair 20R,20R' and a front pair 20F,20F'. A rear pair includes a first v-beam thermal actuator 20R and a second v-beam thermal actuator 20R'. The actuators 20R, 20R', 20F,20F' are opposing and mirror each other in position, form and function, and are equally and angularly offset from the opposing sides of the slide element. The entire linear motor 10 is etched on a MEMS substrate 1 as previously discussed and partially shown in FIG. 2a, where the MEMS substrate is a semiconductor composed of a doped silicon. The semiconductor MEMS substrate has several advantages, including that thin elements of silicon are elastic, and it also has a high melting point (~1400° C.).

An embodiment of a single v-beam thermal actuator 20 is shown in FIG. 2a. There is a left thin half beam 24l and a right thin half beam 24r in electrical series. The thin half beams are planar and joined at a common medial point 27m in a vertex configuration to the cantilever beam 26 and joined at distal points 27r,27l to a set of terminal anchors 22r,22l on the MEMS substrate 1. In about parallel alignment, there is a forward left thin half beam 25l and a forward right thin half beam 25r in electrical series. The forward thin half beams are planar and joined at a common medial point 29m in a vertex configuration to the cantilever beam 26, and joined at distal points 29r,29l to the same set of terminal anchors 22r,22l. The cantilever beam 26 is contiguous with the thin half beams 24l,24r,25l,25r and the contiguousness functions as a multipoint hitch. The cantilever beam 26 is largely restrained from angular movement, but when the actuator is electrically powered, the electrical resistance of the half beams produces ohmic heating and thermal expansion of the half beams. Expansion causes the vertex configurations to be thrust in a direction that strongly correlates with the cantilever beam, and the thrust causes the cantilever beam 26 to likewise translationally move in the same direction.

It is anticipated that additional pairs of half beams may be present in a variation of the embodiment of the single v-beam thermal actuator 20 as shown in FIG. 2a, and that additional pairs of half beams may add force, but would tend to limit potential deformation, and slow down the rate of cooling when the power is off.

Only a fractional length of the cantilever beam 26 is supported by the half beams, and a jutting cantilevered portion terminates in a tip 23. When the actuator is not powered and not residually hot, then the tip is proximate, but not in contact with the slide element 30, which is shown ghost. This configuration is best seen in FIG. 1a.

A perspective view of the slide element 30 is shown in FIG. 3a. As previously discussed, slide element is capable of being moved across the MEMS substrate, as it is has been etched free. A rear end 31 of the slide element is contiguous to a zig-zag spring-like element 42 that is contiguous with an anchor block 54 that is contiguous with the MEMS substrate. As shown in FIG. 3a, at least a portion of the slide element 30 has opposing walls that are about straight, planar and parallel. The slide element 30 is shown as a rectangular element, but this is simply for discussion, and is not a limitation. Only the portions of the slide element that are going to be pushed by an opposing pair of v-beam thermal actuators need opposing walls that are about straight, planar and parallel. The slide element 30, the zig-zag spring-like element 42 and the anchor block 54 are all made of the MEMS substrate, which is nominally a semiconductor material for example doped silicon. As may be seen, the zig-zag spring-like element 42 is relatively thin, and would be susceptible to ohmic heating in the presence of electrical power.

A pair of opposing v-beam thermal actuators are positioned angular to the portion of the slide element 30 having side walls that are about straight, planar and parallel. In the exemplary embodiment of the friction drive linear motor 10 illustrated in FIG. 1a,1b,1c there are a rear pair of v-beam thermal actuators that are opposing and a front pair of v-beam thermal actuators that are opposing. Due to space constraints, the numbering is spread over FIG. 1a,1b,1c. The rear left actuator and the rear right actuator pair are respectfully numbered 20R,20R'; and the front left actuator and the front right actuator pair are respectfully numbered 20F,20F'. In short, if the actuator is on the right side of the slide element 30 it has an apostrophe, if the actuator is on the left side of the slide element 30 it does not have an apostrophe. The numbering system is applied to the individual elements of the v-beam thermal actuators. The left rear actuator has two terminal anchors, a left terminal anchor 22Rl and a right terminal anchor 22Rr. The right rear actuator has two terminal anchors, a left terminal anchor 22Rl' and a right terminal anchor 22Rr'. The left rear actuator has four half beams 24Rl,24Rr,25Rl,25Rr. The right rear actuator has four half beams 24Rl',24Rr',25Rl',25Rr'. The left front actuator has four half beams 24Fl,24Fr,25Fl,25Fr. The right front actuator has four half beams 24Fl',24Fr',25Fl',25Fr'. The left rear actuator has one cantilever beam 26R with a tip 63R and the right rear actuator has one cantilever beam 26R' with a tip 63R'. The left front actuator has one cantilever beam 26F with a tip 63F and the right front actuator has one cantilever beam 26F' with a tip 63F' as indicated in FIG. 1a.

The rear end 31 of the slide element 30 is contiguous to the zig-zag spring-like element 42 that is contiguous with the anchor block 54. A dashed line in FIG. 1a is terminated by the word "Start." This configuration is the starting position of the elements of the invention. Note that the tips 63R,63F,63R', 63F' of all the cantilever beams are proximate to the side walls 32l,32r of the slide element 30, but not in contact with them.

In FIG. 1b, a modulated current has been provided, and all four cantilever beams on the front and rear opposing v-beam thermal actuators are contacting the sidewalls. The actuated cantilever beams generate enough friction through impingement contact of the tips of the cantilever beams against a straight side wall of the slide element so that the frictional resistance between the tip and the side wall may be greater than the resistance of the slide element to move. As the actuators are on opposing sides of the slide element, the friction at least doubles as the slide element is pinched between opposing actuators. In the instant case, there are two pair of opposing actuators so the friction is even higher.

Figure 2B:
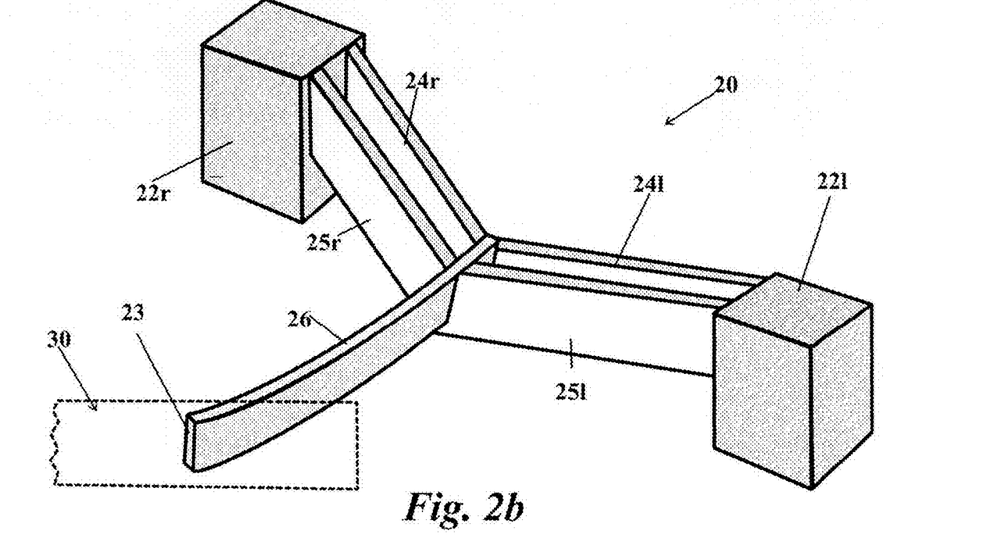
FIG. 2b is a perspective view of the v-beam actuator as illustrated in FIG. 2a and the slider element shown in ghost, where the half beams are ohmically heated and therefore expanded, especially lengthwise, and flexed at the v causing the cantilever beam to angularly push against the slide element.

The perspective view of one of the actuators shown diagrammatically in FIG. 1b is shown in FIG. 2b. As is readily apparent, the cantilever beam 26 is bending, but the end tip 23 is not lateral to a side wall of the slide element 30.

Shortly thereafter, as shown in FIG. 1c, the tips have bent so they are nearly parallel to the sidewalls 32l,32r of the slide element. The bending increases the surface contact, which cumulatively could increase the total friction. The dashed line is now shown as finish line, where the zig-zag spring-like element 42 has been stretched to a desired point and tension. The anchor block 54 does not move.

Figure 2C:
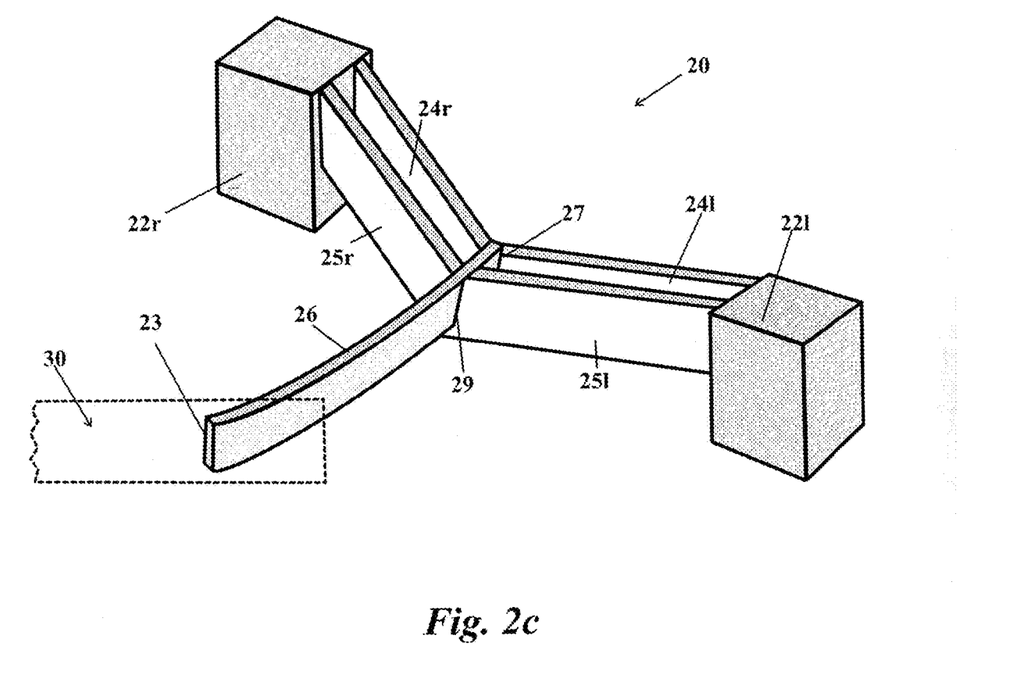
FIG. 2c is a perspective view of the v-beam actuators as illustrated in FIG. 2b and the slider element shown in ghost, where the half beams are fully ohmically heated and the cantilever beam is extended to the length of its throw, where a tip of the cantilever beam is curved nearly parallel and frictionally pushing against the slide element.

The perspective view of one of the actuators that is shown diagrammatically in FIG. 1c is shown in FIG. 2c. As is readily apparent the end tip 23 is bent nearly lateral to a side wall of the slide element 30.

In one exemplary embodiment, the rate of movement may be as high as about 66 mm/s (about 2.6 inches/sec).

There are at least three controlling schemes of powering the friction drive linear motor. In a first controlling scheme, the front v-beam thermal actuators have a modulated current while the rear v-beam thermal actuators have a constant current that maintains the rear v-beam thermal actuators in a braking mode, where the modulated current is cycled from full a full voltage to no voltage, and the constant current is kept at an intermediate voltage that is high enough to maintain sufficient friction that the slide element is braked. In FIG. 1b, the cantilever beams have not reached their full throw, and depend on the exact properties of the linear motor where the position of the cantilever beams exemplifies a braking position. Of course, in the first controlling scheme, the role of v-beam thermal actuators may be reversed. The key is one opposing pair is in a mode where the power is modulated and while the second opposing pair of v-beam thermal actuators is in a mode where the power is constant.

In a second controlling scheme, one opposing pair of v-beam thermal actuators have a modulated current and another opposing pair of v-beam thermal actuators have a phase shifted modulated current. In this scheme, the power is staggered, such that one opposing pair is resetting and restarting as the other pair is going from a braking position to a full throw position and back to a braking position. It takes a finite increment of time to reach full ohmic heating/expansion and then to cool back down.

In a third controlling scheme, all of the opposing pairs of v-beam thermal actuators have a modulated current, where there is no braking mode, where a frequency of modulation is about 300 Hz plus or minus 100 Hz.

Figure 4:
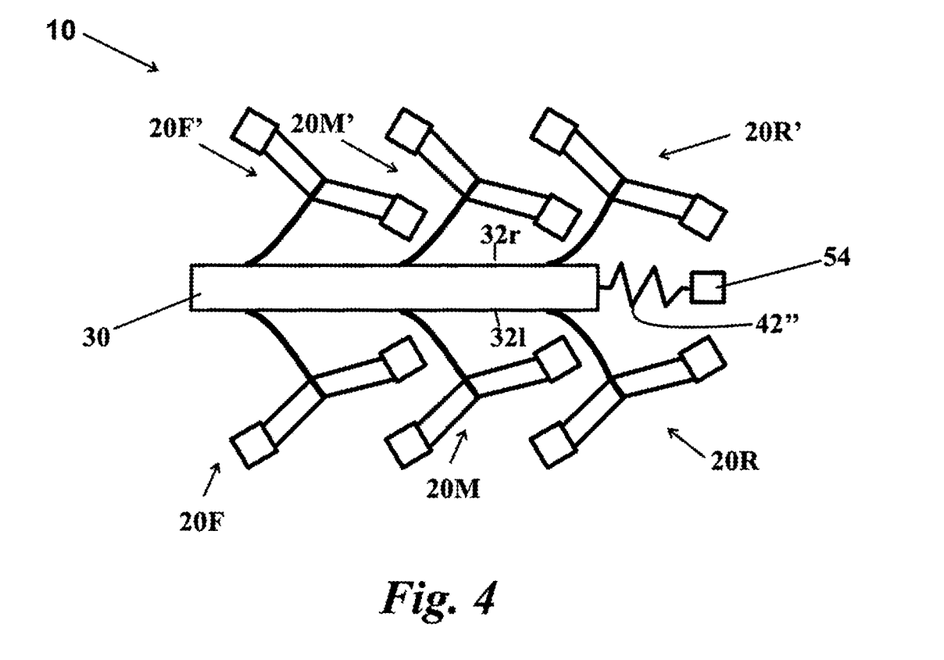
FIG. 4 is a diagrammatic view of a friction driven linear motor, where the motor has three opposing pairs of v-beam actuators.

In the friction driven linear motor 10 shown in FIG. 4, the motor includes three opposing pairs of v-beam actuators, where a middle pair has two actuators 20M and 20M'. As currently shown, all of the opposing pairs of v-beam thermal actuators have a modulated current, where there is no braking mode, which is the third controlling scheme.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A MEMS friction drive linear motor, comprising:
a slide element that has a portion with a first straight side, a second straight side and a rear end, wherein the first straight side and the second straight side are opposing sides of the slide element, and the rear end is contiguous with a zig-zag spring-like element that is contiguous with an anchor block that is contiguous with a MEMS substrate, wherein the zig-zag spring-like element elastically deforms as the slide element moves away from the anchor block;
a rear pair of opposing v-beam thermal actuators, wherein a rear first v-beam thermal actuator and a rear second v-beam thermal actuator mirror each other in position, form and function, and are equally and angularly offset from the opposing sides of the slide element, wherein the rear pair of opposing v-beam thermal actuators are etched on a MEMS substrate, wherein each of the v-beam thermal actuators has a projecting cantilever beam with an end tip, and a left and right set of thin parallel half beams that are joined at medial points in a vertex configuration to a section of the cantilever beam, and joined at distal points to a set of terminal anchors on the MEMS substrate,
wherein the section is a fractional length of a total length of the cantilever beam;
a front pair of opposing v-beam thermal actuators positioned further along the slide element, wherein the front pair of opposing v-beam thermal actuators is otherwise identical to the rear pair of opposing v-beam thermal actuators;
wherein a current is provided for a time interval, where the current selectively actuates at least one pair of the opposing v-beam thermal actuators, where actuation causes the half beams to thermally expand causing each vertex configuration of the v-beam thermal actuators and their cantilever beams to be thrust toward the slide element, wherein at least a pair of the end tips are extended from a noncontact position, which is proximate to the slide element, to a contact position, wherein cumulatively and about simultaneously, each of the at least a pair of the end tips of the cantilever beam angularly impinges the first straight side and the opposing cantilever beam angularly impinges the second straight side of the slide element, therein imparting translational movement to the slide element of the linear motor;

wherein as the cantilever beams on the v-beam thermal actuator on the first side and the v-beam thermal actuator on second side reach their maximum throw, the pair of end tips bend until they are approximately parallel with the straight side, and there is an increased area of frictional contact between the cantilever beams and the straight sides of the slide element, and the greater surface area compensates for an increasing acute angle of impingement, therein enabling further translational movement to be generated; and wherein when the current is off all the cantilever beams are retracted, and there is no force to prevent the slide element from returning to a starting position, therein relieving tension in the zig-zag spring-like element.

2. The MEMS friction drive linear motor according to claim 1, wherein said MEMS substrate is a semiconductor, and wherein said MEMS substrate is a doped silicon.

3. The MEMS friction drive linear motor according to claim 1, wherein said set of terminal anchors is angularly oriented to the slide element.

4. The MEMS friction drive linear motor according to claim 1, wherein said left and right set of thin parallel half beams are one twenty fifth to one hundredth in thickness of the terminal anchors, and therefore have rapid ohmic heating.

5. The MEMS friction drive linear motor according to claim 1, wherein the current of one of the opposing pair of v-beam thermal actuators is modulated while the current in another of the opposing pair of v-beam thermal actuators is a constant current that maintains the opposing pair of v-beam thermal actuators in a braking mode.

6. The MEMS friction drive linear motor according to claim 1, wherein the current of one of the opposing pair of v-beam thermal actuators is modulated and the current in the other of the opposing pair of v-beam thermal actuators is a phase shifted modulated current.

7. The MEMS friction drive linear motor according to claim 1, wherein the current in both the front opposing pair of v-beam thermal actuators and the rear opposing pair of v-beam thermal actuators is a modulated current, wherein there is no braking mode, wherein the modulated current has a frequency of about 300 Hz plus or minus 100 Hz.

8. The MEMS friction drive linear motor according to claim 7, wherein at the frequency none of the opposing pairs of v-beam thermal actuators have enough time to cool, which would allow the slide element to slide backwards, and before cooling one or both of the front and rear opposing pairs v-beam thermal actuators are actuated again.

9. The MEMS friction drive linear motor according to claim 1, wherein the translational movement is at most about 2.5 mm.

10. The MEMS friction drive linear motor according to claim 1, wherein the motor has a size that is about 4 mm by about 9 mm.

11. A MEMS friction drive linear motor, comprising:
a slide element that has a portion with a first straight side, a second straight side and a rear end, wherein the first straight side and the second straight side are opposing sides of the slide element, and the rear end is contiguous with a zig-zag spring-like element that is contiguous with an anchor block that is contiguous with a MEMS substrate, wherein the zig-zag spring-like element elastically deforms as the slide element moves away from the anchor block;
a rear pair of opposing v-beam thermal actuators, wherein a rear first v-beam thermal actuator and a rear second v-beam thermal actuator mirror each other in position, form and function, and are equally and angularly offset from the opposing sides of the slide element, wherein the rear pair of opposing v-beam thermal actuators are etched on a MEMS substrate, wherein each of the v-beam thermal actuators has a projecting cantilever beam with an end tip, and a left and right set of thin parallel half beams that are joined at medial points in a vertex configuration to a section of the cantilever beam, and joined at distal points to a set of terminal anchors on the MEMS substrate;
a plurality of middle opposing pairs of v-beam thermal actuators positioned further along the slide element, wherein the plurality of middle opposing pairs of v-beam thermal actuators is otherwise identical to the rear pair of opposing v-beam thermal actuators;
a front pair of opposing v-beam thermal actuators positioned further along the slide element, wherein the front pair of opposing v-beam thermal actuators is otherwise identical to the rear pair of v-beam thermal actuators;
wherein a current is provided for a time interval, where the current selectively actuates at least one pair of the opposing v-beam thermal actuators, where actuation causes the half beams to thermally expand causing each vertex configuration of the v-beam thermal actuators and their cantilever beams to be thrust toward the slide element, wherein at least a pair of the end tips are extended from a noncontact position, which is proximate to the slide element, to a contact position, wherein cumulatively and about simultaneously, each of the at least a pair of the end tips of the cantilever beam angularly impinges the first straight side and the opposing cantilever beam angularly impinges the second straight side of the slide element, therein imparting translational movement to the slide element of the linear motor;
wherein as opposing cantilever beams on the opposing v-beam thermal actuators reach their maximum throw, the end tips bend until they are approximately parallel with the straight side that the end tip is impinging, resulting in an increased area of frictional contact between the cantilever beams and the straight sides of the slide element, and the greater surface area compensates for an increasing acute angle of impingement, therein enabling further translational movement to be generated; and
wherein when the current is off all the cantilever beams are retracted, and there is no force to prevent the slide element from returning to a starting position, therein relieving tension in the zig-zag spring-like element.

12. The MEMS friction drive linear motor according to claim 11, wherein said MEMS substrate is a semiconductor.

13. The MEMS friction drive linear motor according to claim 11, wherein said MEMS substrate is a doped silicon.

14. The MEMS friction drive linear motor according to claim 11, wherein said left and right set of thin parallel half beams are one twenty-fifth to one hundredth in thickness of the terminal anchors, and therefore the half beams have rapid ohmic heating.

15. The MEMS friction drive linear motor according to claim 11, wherein the current of one of the opposing pair of v-beam thermal actuators is modulated while the current in another of the opposing pair of v-beam thermal actuators is a constant current that maintains the opposing pair of v-beam thermal actuators in a braking mode.

16. The MEMS friction drive linear motor according to claim 11, wherein the current of one of the opposing pair of v-beam thermal actuators is modulated and the current in the other of the opposing pair of v-beam thermal actuators is a phase shifted modulated current.

17. The MEMS friction drive linear motor according to claim 11, wherein the current in all of the opposing pairs of v-beam thermal actuators has a modulated current, wherein there is no braking mode, wherein the modulated current has a frequency of about 300 Hz plus or minus 100 Hz.

18. The MEMS friction drive linear motor according to claim 17, wherein before any of the opposing pairs of v-beam thermal actuators has enough time to cool allowing the slide element to return, all of the opposing pairs of v-beam thermal actuators are actuated again.

19. The MEMS friction drive linear motor according to claim 11, wherein the plurality of opposing middle pairs comprises at least one opposing middle pair.

20. A MEMS friction drive linear motor, comprising:
a slide element that has a portion with a first straight side, a second straight side and a rear end, wherein the first straight side and the second straight side are opposing sides of the slide element, and the rear end is contiguous with a spring-like element that is contiguous with an anchor block that is contiguous with a MEMS substrate, wherein the spring-like element elastically deforms as the slide element moves away from the anchor block;
at least one opposing pair of v-beam thermal actuators, wherein a first v-beam thermal actuator and a second v-beam thermal actuator mirror each other in position, form and function, and are equally and angularly offset from the opposing sides of the slide element, wherein the at least one opposing pair of v-beam thermal actuators are etched on a MEMS substrate, wherein each of the v-beam thermal actuators has a projecting cantilever beam with an end tip, and a left and right set of thin parallel half beams that are joined at medial points in a vertex configuration to a section of the cantilever beam, and joined at distal points to a set of terminal anchors on the MEMS substrate;
wherein a current is provided for a time interval, where the current selectively actuates the at least one opposing pair of v-beam thermal actuators, wherein actuation causes the half beams to thermally expand causing each vertex configuration of a v-beam thermal actuator and a cantilever beam to be thrust toward the slide element, wherein the cantilever beam has an end tip that extends from a noncontact position which is proximate to the slide element to a contact position, wherein cumulatively and about simultaneously, the end tip of the cantilever beam angularly impinges the first straight side and an opposing cantilever beam angularly impinges the second straight side of the slide element, therein imparting translational movement to the slide element of the linear motor;
wherein as the cantilever beam on the v-beam thermal actuator on the first side of the slide element and the opposing cantilever beam on the opposing v-beam thermal actuator on the second side of the slide element reach their maximum throw, the end tip of the cantilever beam and an opposing end tip on the opposing cantilever beam about simultaneously bend until the end tips are approximately parallel with the straight side, and there is an increased area of frictional contact between the cantilever beams and the straight sides of the slide element, and the greater surface area compensates for an increasing acute angle of impingement, therein enabling further translational movement to be generated; and
wherein when the current is off all of the cantilever beams are retracted, there is no force to prevent the slide element from returning to a start position, therein relieving tension in the spring-like element.

* * * * *